United States Patent
Lee et al.

(10) Patent No.: US 7,285,788 B2
(45) Date of Patent: Oct. 23, 2007

(54) ION BEAM EXTRACTOR

(75) Inventors: Yung Hee Lee, Suwon-si (KR); Yun Kwang Jeon, Seoul (KR); Jin Seok Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 69 days.

(21) Appl. No.: 11/208,728

(22) Filed: Aug. 23, 2005

(65) Prior Publication Data
US 2006/0152164 A1    Jul. 13, 2006

(30) Foreign Application Priority Data
Jan. 7, 2005    (KR) .................... 10-2005-001719

(51) Int. Cl.
*H01J 27/00*    (2006.01)
*H01J 49/42*    (2006.01)
(52) U.S. Cl. .................... 250/423 R; 250/396 R
(58) Field of Classification Search ........... 315/111.81; 250/396 R, 398, 423 R, 492.1, 492.2, 492.21, 250/492.3
See application file for complete search history.

(56) References Cited

U.S. PATENT DOCUMENTS

| 4,381,453 | A | * | 4/1983 | Cuomo et al. .............. 250/398 |
| 6,759,807 | B2 | | 7/2004 | Wahlin .................. 315/111.21 |
| 6,804,288 | B2 | | 10/2004 | Haraguchi .................... 373/10 |
| 2003/0098126 | A1 | | 5/2003 | Yeom et al. ........... 156/345.39 |
| 2004/0222367 | A1 | * | 11/2004 | Ichiki et al. ................ 250/251 |

FOREIGN PATENT DOCUMENTS

JP    08-096742    4/1996

\* cited by examiner

*Primary Examiner*—Thuy Vinh Tran
(74) *Attorney, Agent, or Firm*—Stanzione & Kim, LLP (57) ABSTRACT

An ion beam extractor controls a direction and an intensity of ion beams by adjusting a voltage applied to a grid having slits formed therein, thereby enhancing uniformity of an etching rate of a wafer, leading to an increase of productivity of semiconductor diodes. The ion beam extractor comprises an ion source to produce an ion beam and at least one grid located at a rear end of the ion source in a progressing path of the ion beam produced by the ion source to adjust a direction of the ion beam by controlling a voltage applied to the at least one grid.

25 Claims, 10 Drawing Sheets

ION BEAM EXTRACTOR

CROSS-REFERENCE TO RELATED APPLICATIONS

This application claims the benefit of Korean Patent Application No. 2005-1719, filed on Jan. 7, 2005 in the Korean Intellectual Property Office, the disclosure of which is incorporated herein in its entirety by reference.

BACKGROUND OF THE INVENTION

1. Field of the Invention

The present general inventive concept relates to generation of ion beams of a semiconductor neutral beam etcher, and more particularly, to an ion beam extractor that controls a direction and an intensity of ion beams by adjusting a voltage applied to a grid having slits formed therein.

2. Description of the Related Art

Recently, according to increasing requirements for integration of semiconductor diodes, a design rule for semiconductor integration circuits has been reduced, requiring a critical dimension of 0.25 um (micrometers) or less. Etchers for ion reinforcement, such as a high-density plasma etcher, a reactive ion etcher, and the like, are typically used to realize this critical dimension of the semiconductor diodes.

In a semiconductor fabrication process, a grid for generation of high ion flux is used to process a wafer with ion beams or neutral beams.

Figure 1:
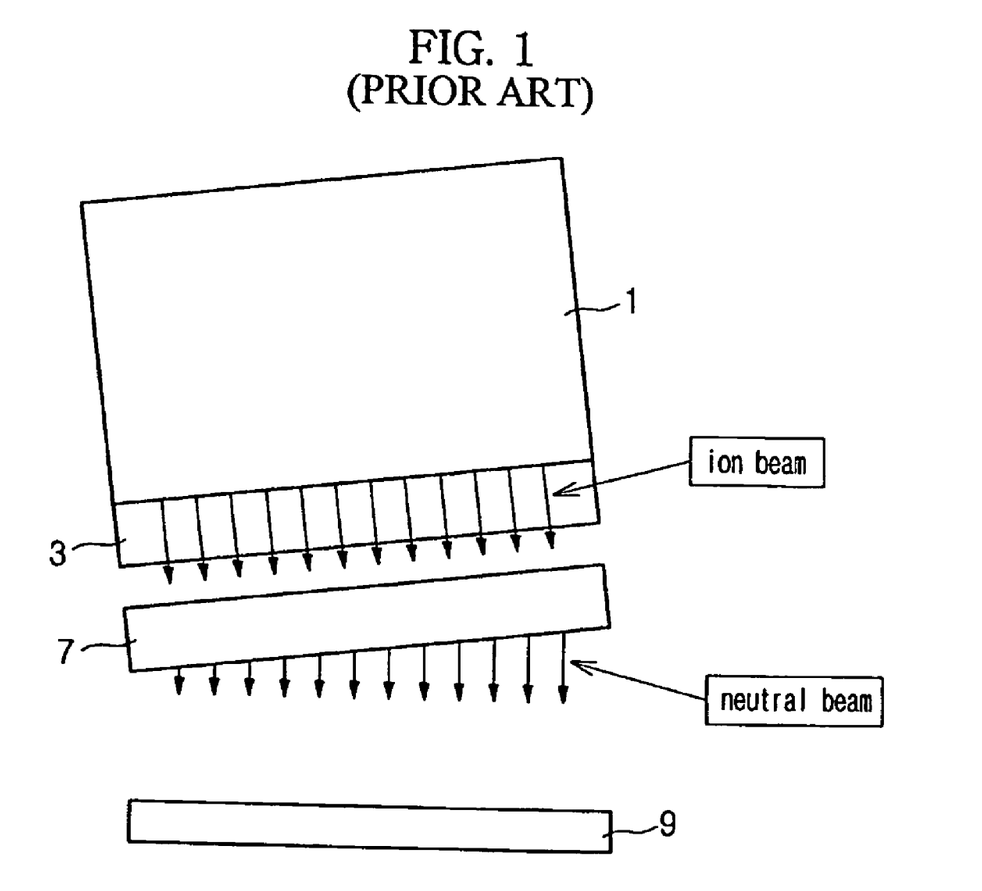
FIG. 1 is a schematic structural view illustrating a conventional neutral beam chamber.
Figure 2:
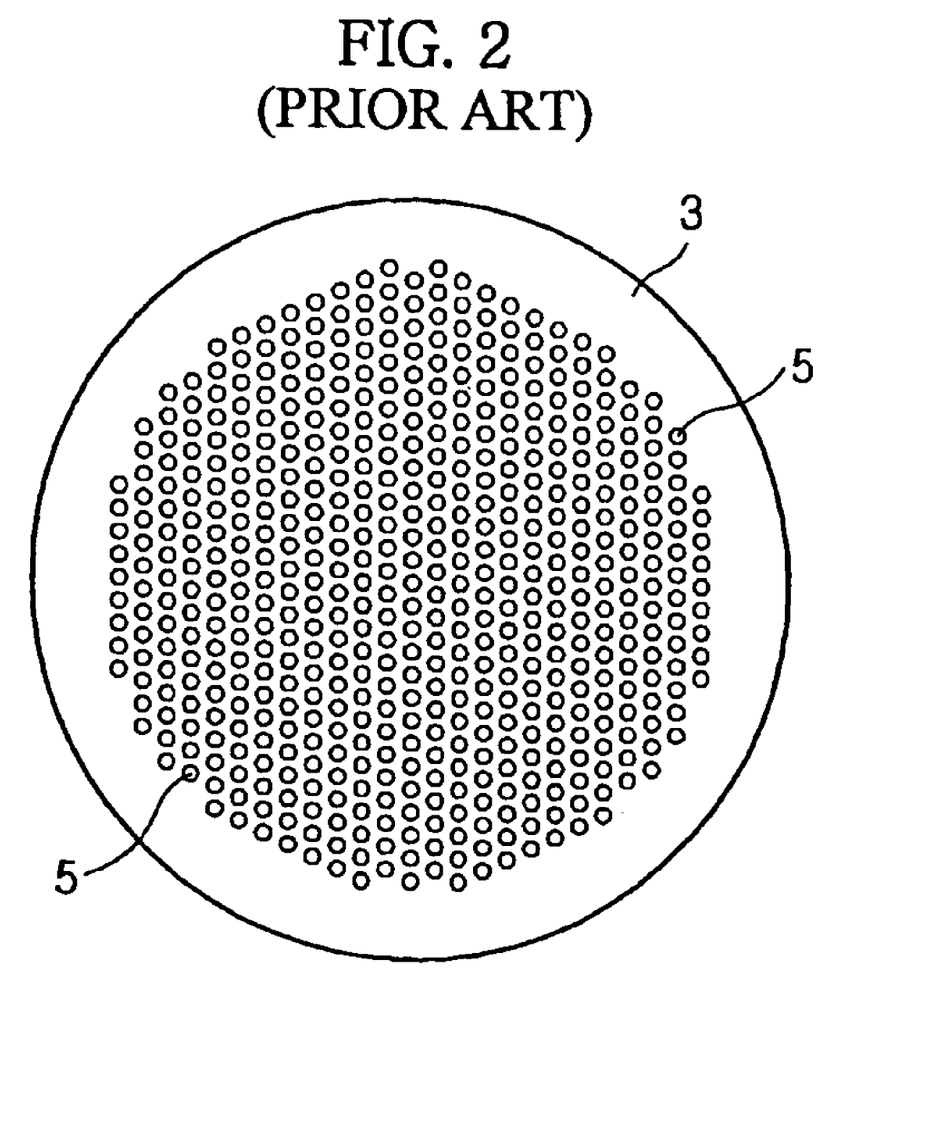
FIG. 2 is a plan view illustrating a conventional grid of the neutral beam chamber of FIG. 1.

FIGS. 1 and 2 illustrate a neutral beam chamber having a conventional grid 3. As illustrated in FIGS. 1 and 2, the grid 3 used for neutral beam etching has a plurality of circular holes 5 through which ion beams produced by an ion source 1 (plasma) pass to cover an entire surface of a wafer 9. The diameter of each hole is about 3~6 mm (millimeters).

The grid 3 is located at a rear end of an ion source 1 on a path of the ion beams to accelerate the ion beams using an electric field generated by application of a voltage thereto. At the same time, the grid 3 adjusts energy of the ion beams by focusing the ion beams using the plurality of holes 5 through which the ion beams pass.

A reflector 7 is spaced slightly apart from the rear end of the grid 3 and reflects the ion beams incident thereto and transforms the reflected ion beams into neutral beams. The reflector 7 is slightly slanted with respect to the wafer 9 (at an angle of about 5~9°) in order to allow efficient etching for a wall of the wafer 9.

When the ion beams generated by the ion source 1 pass through the grid 3, the conventional grid 3 extracts the ion beams passing through the grid 3 and focuses the extracted ion beams to generate the neutral beams, which are used for etching an object film on the wafer 9 of a semiconductor substrate.

An ion flux is influenced by a density of plasma, a shape of the grid 3, a thickness of the grid 3, a size of the grid 3, and the electric field created by applying the voltage to the grid 3. Furthermore, since the grid 3 has the plurality of holes 5, the wafer 9 is typically rotated in order to enhance a uniformity of an etching rate for the wafer 9.

As described above, since the plurality of holes 5 for generating the neutral beams are arranged on an area of the grid 3 corresponding to an area of the wafer 9, and allow the ion beams to pass therethrough, resulting in an ion beam extraction area below 20~30% of the entire area of a plate on which the wafer 9 is positioned, it becomes necessary to increase the density of the plasma or the electric field.

When increasing the density of the plasma, there is a problem in that a direction of the ion beams is difficult to control by adjusting the electric field due to the fact that the neutral beam chamber typically comprises two or three electrodes in the grid 3.

Additionally, since the wafer 9 is rotated to enhance the uniformity of the etching rate, there is a problem in that an angle of the ion source 1 must be changed in order to change an angle of the ion beams.

SUMMARY OF THE INVENTION

The present general inventive concept provides an ion beam extractor to extract a rectangular ion beam using a grid having slits formed therein, thereby increasing an ion beam extraction area and producing a high ion flux.

The present general inventive concept also provides the ion beam extractor having a plurality of stacked grids, each having slits formed therein, such that a direction of the ion beam is adjusted by controlling a voltage applied to each of the plurality of stacked grids.

The present general inventive concept also provides the ion beam extractor to control the direction of the ion beam by application of the voltage thereto, thereby allowing application of the ion beam extractor to various processes without modification of hardware components.

The present general inventive concept also provides the ion beam extractor to control the direction and an intensity of the ion beam, thereby securing uniformity of a film while enhancing uniformity of an etching rate of a wafer, thereby increasing productivity of semiconductor diodes.

Additional aspects and/or advantages of the general inventive concept will be set forth in part in the description which follows and, in part, will be obvious from the description, or may be learned by practice of the general inventive concept.

The foregoing and/or other aspects and advantages of the present general inventive concept are achieved by providing an ion beam extractor, comprising an ion source to produce an ion beam from a plasma, and at least one grid located at a rear end of the ion source in a progressing path of the ion beam produced by the ion source to adjust a direction of the ion beam by controlling a voltage applied to the at least one grid.

The at least one grid may comprise a plurality of plates to which different voltages are applied, respectively.

The plurality of plates may be arranged to correspond with respect to each other such that at least one slit through which the ion beam passes is formed between each pair of corresponding plates.

The at least one grid may be formed with at least one slit through which the ion beam passes.

The at least one slit may comprise a plurality of slits to extract a rectangular ion beam.

The at least one grid may comprise a plurality of grids stacked below the rear end of the ion source, each of the plurality of grids having the at least one slit formed therein, thereby allowing voltages that are applied to the respective grids to be controlled to adjust the direction of the ion beam. The at least one slit in each of the plurality of grids may have respective centers offset with respect to one another.

The ion beam extractor may further comprise a reflector located in parallel with a wafer at the same angle with respect to the wafer as that of the ion source to reflect the ion beam that passes through the grid toward the wafer and to transform the reflected ion beam into a neutral beam.

The foregoing and/or other aspects and advantages of the present general inventive concept are also achieved by providing an ion beam extractor, comprising an ion source to produce an ion beam from a plasma, and a plurality of grids located at a rear end of the ion source in a progressing path of the ion beam produced by the ion source to adjust a direction of the ion beam by controlling one or more voltages applied to the plurality of grids.

The plurality of grids may be a plurality of grids stacked below the rear end of the ion source, each of the plurality of grids having a slit formed therein to allow the ion beam to pass therethrough.

Each of the plurality of grids may comprise a plurality of plates, and different voltages may be applied to the respective grids to adjust the direction of the ion beam.

Different voltages are applied to the plurality of grids, respectively, such that the direction of the ion beam is adjusted according to a magnitude of the different applied voltages.

BRIEF DESCRIPTION OF THE DRAWINGS

These and/or other aspects and advantages of the general inventive concept will become apparent and more readily appreciated from the following description of the embodiments, taken in conjunction with the accompanying drawings, of which.

DETAILED DESCRIPTION OF THE PREFERRED EMBODIMENTS

Reference will now be made in detail to the embodiments of the present general inventive concept, examples of which are illustrated in the accompanying drawings. The embodiments are described below to explain the present general inventive concept by referring to the figures.

Figure 3:
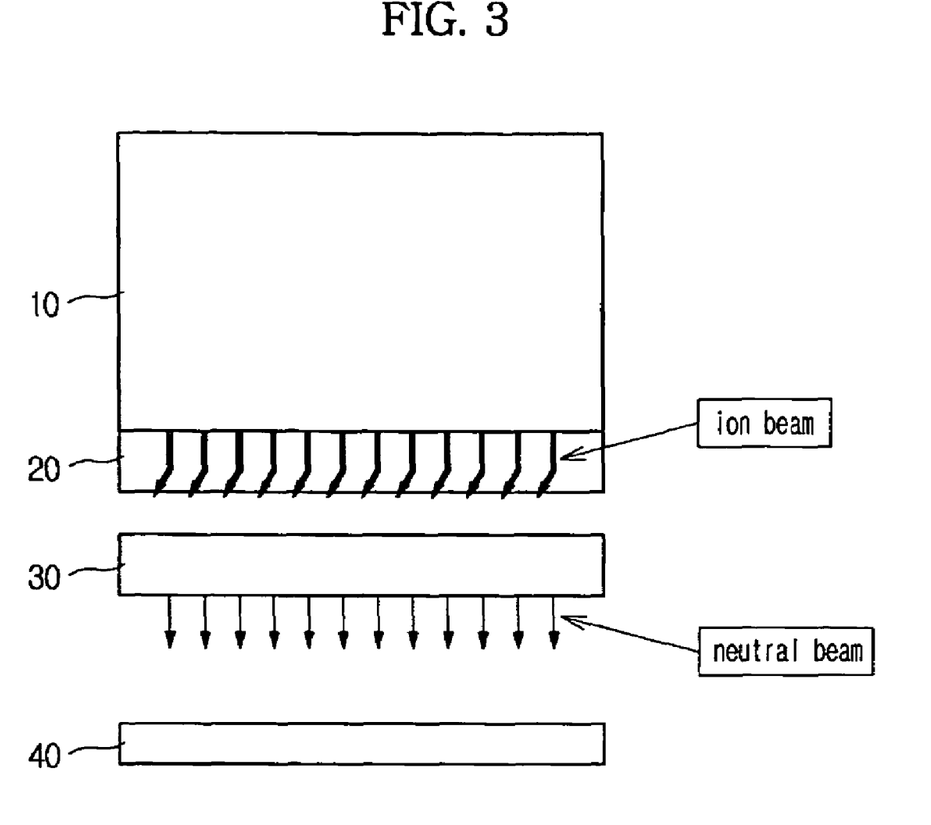
FIG. 3 is a schematic structural view illustrating a neutral beam chamber according to the present general inventive concept.

FIG. 3 is a schematic structural view illustrating a neutral beam chamber according to an embodiment of the present general inventive concept.

Referring to FIG. 3, the neutral beam chamber includes an ion source 10 to produce ion beams, a grid 20 located at a rear end of the ion source 10, a reflector 30 located at a rear end of the grid 20, and a wafer 40 located at a rear end of the reflector 30. After the ion beams produced by the ion source 10 pass through a plurality of slits 20a (FIG. 4) formed in the grid 20, the ion beams are reflected by the reflector 30 and are transformed into neutral beams. The neutral beams are then incident on the wafer 40 to etch an object film on the wafer 40.

The ion source 10 generates the ion beams from various reactant gases. The ion source 10 may comprise a plasma generating apparatus that generates plasma by application of high frequency energy. Alternatively, other types of ion sources may also be used.

The grid 20 is coupled to the rear end of the ion source 10 to accelerate the ion beams by application of a voltage while the ion beams pass through the plurality of slits 20a formed in the grid 20. The grid 20 may have various shapes, which will be described hereinafter with reference to FIGS. 4 to 6.

The reflector 30 is located slightly apart from the grid 20 to reflect the ion beams incident thereto and to transform the reflected ion beams into the neutral beams. The reflector 30 is arranged parallel with the wafer 40, and may be slanted at the same angle as that of the ion source 10.

Figure 4:
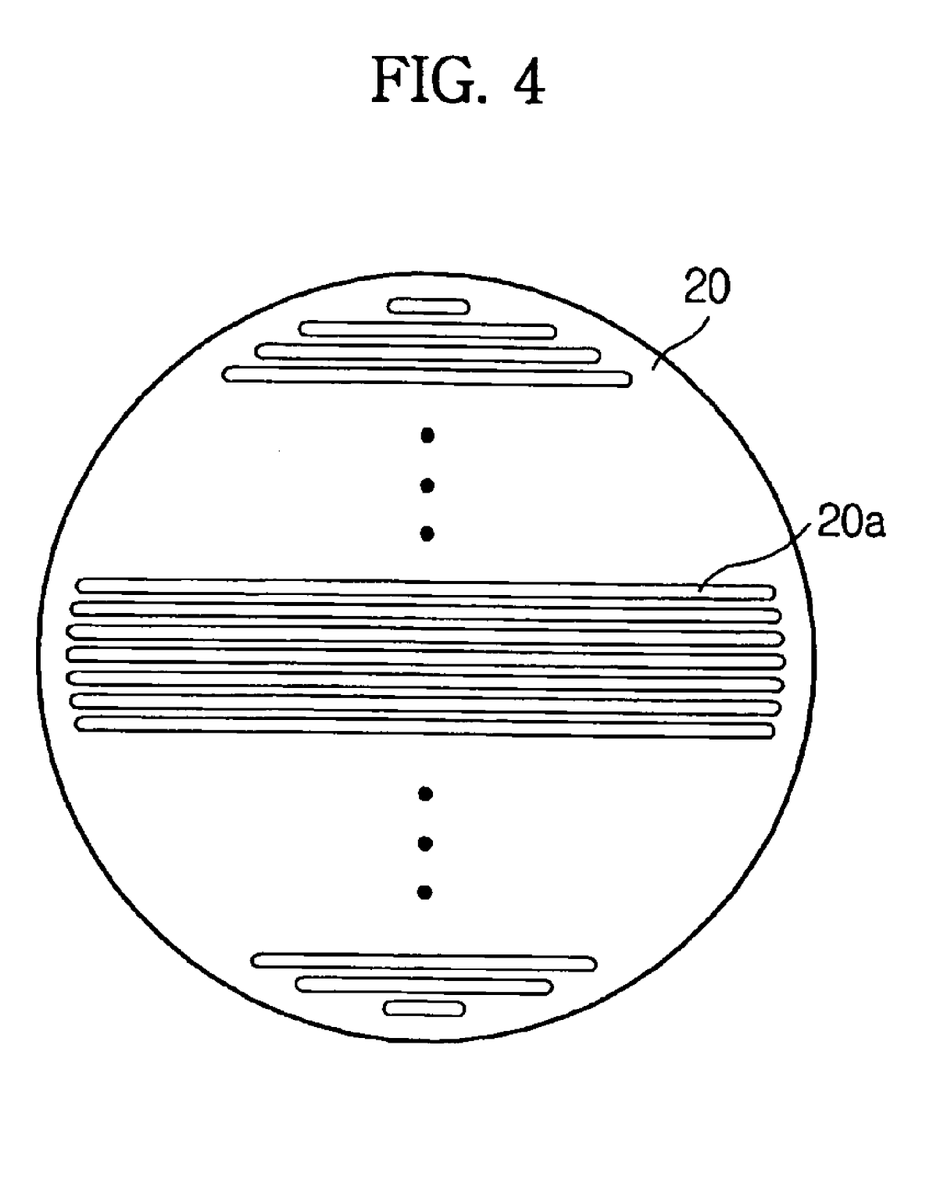
FIG. 4 is a plan view illustrating a grid according to an embodiment of the present general inventive concept.

FIG. 4 is a plan view illustrating a grid according to an embodiment of the general inventive concept.

Referring to FIGS. 3 and 4, the grid 20 of the general inventive concept has the plurality of slits 20a, each having a predetermined diameter. The grid 20 increases an ion beam extraction area to 50% or more of an entire area of a plate on which the wafer 40 is positioned by extracting rectangular ion beams from the ion beams passing through the plurality of slits 20a, thereby increasing an ion density in comparison to the conventional grid of FIGS. 1 and 2, which has an ion beam extraction area of 20~30% of the entire area of the plate.

Accordingly, since the ion density can be increased to generate a high ion flux without by increasing an output of the ion source 10 (e.g., by increasing the plasma density), the flux of the ion beams can be easily controlled.

Figure 5:
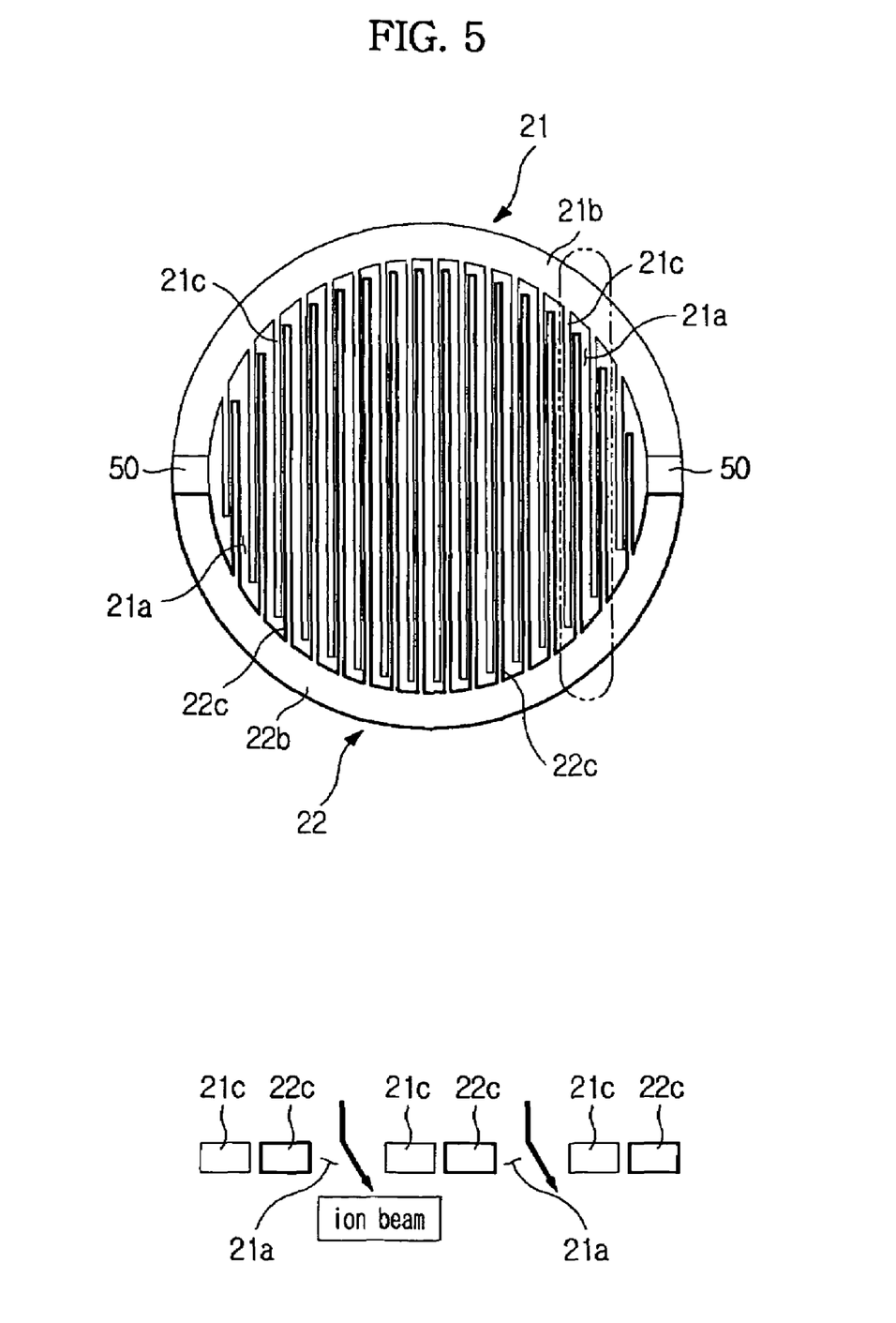
FIG. 5 is a plan view illustrating a grid according to another embodiment of the present general inventive concept.

FIG. 5 is a plan view illustrating a grid according to another embodiment of the general inventive concept.

Referring to FIGS. 3 and 5, the grid consists of two grids including a first grid 21 and a second grid 22 arranged to correspond to each other in an engaging state such that a plurality of slits 21a are formed therebetween. The first and second grids 21 and 22 comprise a first electrode member 21b and a second electrode 22b, respectively. The first and second electrode members 21b and 22b have a semi-circular arc shape. The first and second grids 21 and 22 further comprise a first plurality of bars 21c and a second plurality of bars 22c, respectively, which define a circle with the entire outer peripheral ends of the first and second plurality of bars 21c and 22c. Accordingly, the first and second plurality of bars 21c and 22c are matched with each other, thereby forming the plurality of slits 21a having a rectangular shape.

Isolators 50 are located at both sides between the semi-circular arc-shaped first and second electrode members 21b and 22b. A first voltage V (not shown) and a second voltage V' (not shown) are applied to the first grid 21 and the second grid 22, respectively. The first and second voltages V and V' may be different from each other or the first and second voltages V and V' may be equal.

As a result, a direction of the ion beams can be controlled by applying the first voltage V to the first grid 21 while applying the second voltage V' to the second grid 22, thereby enhancing an etching rate uniformity and a wafer etching depth uniformity.

Figure 6A:
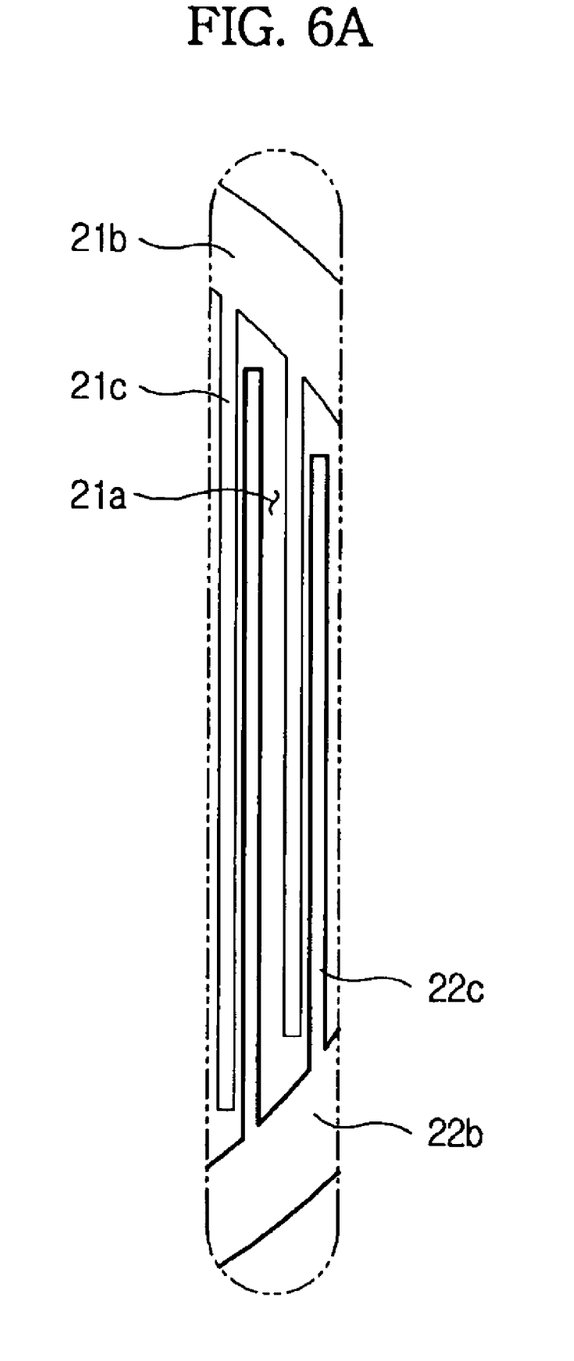
FIG. 6A is a view illustrating a shape of a slit formed in the grid of FIG. 5 according to an embodiment of the present general inventive concept.
Figure 6B:
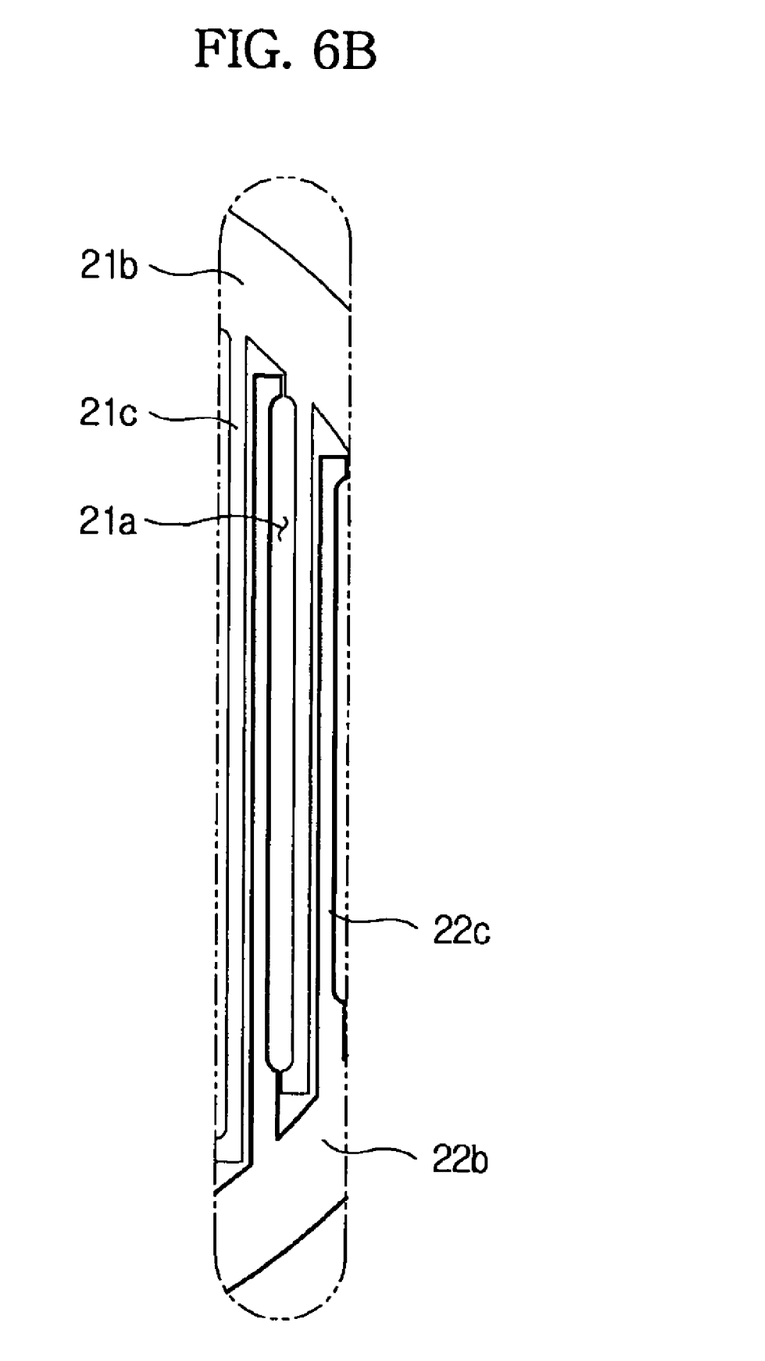
FIG. 6B is a view illustrating another shape of a slit formed in the grid of FIG. 5 according to another embodiment of the present general inventive concept.

FIG. 6A is a view illustrating a shape of a slit formed in the grid of FIG. 5 according to an embodiment of the present general inventive concept, and FIG. 6B is a view illustrating another shape of a slit formed in the grid of FIG. 5 according to another embodiment of the present general inventive concept.

FIGS. 6A and 6B illustrate the shapes of the slit 21a formed between the first and second grids 21 and 22 of FIG. 5, in which various modifications of the first and second plurality of bars 21c and 22c are formed between the first and second electrode members 21b and 22b, respectively.

Figure 7:
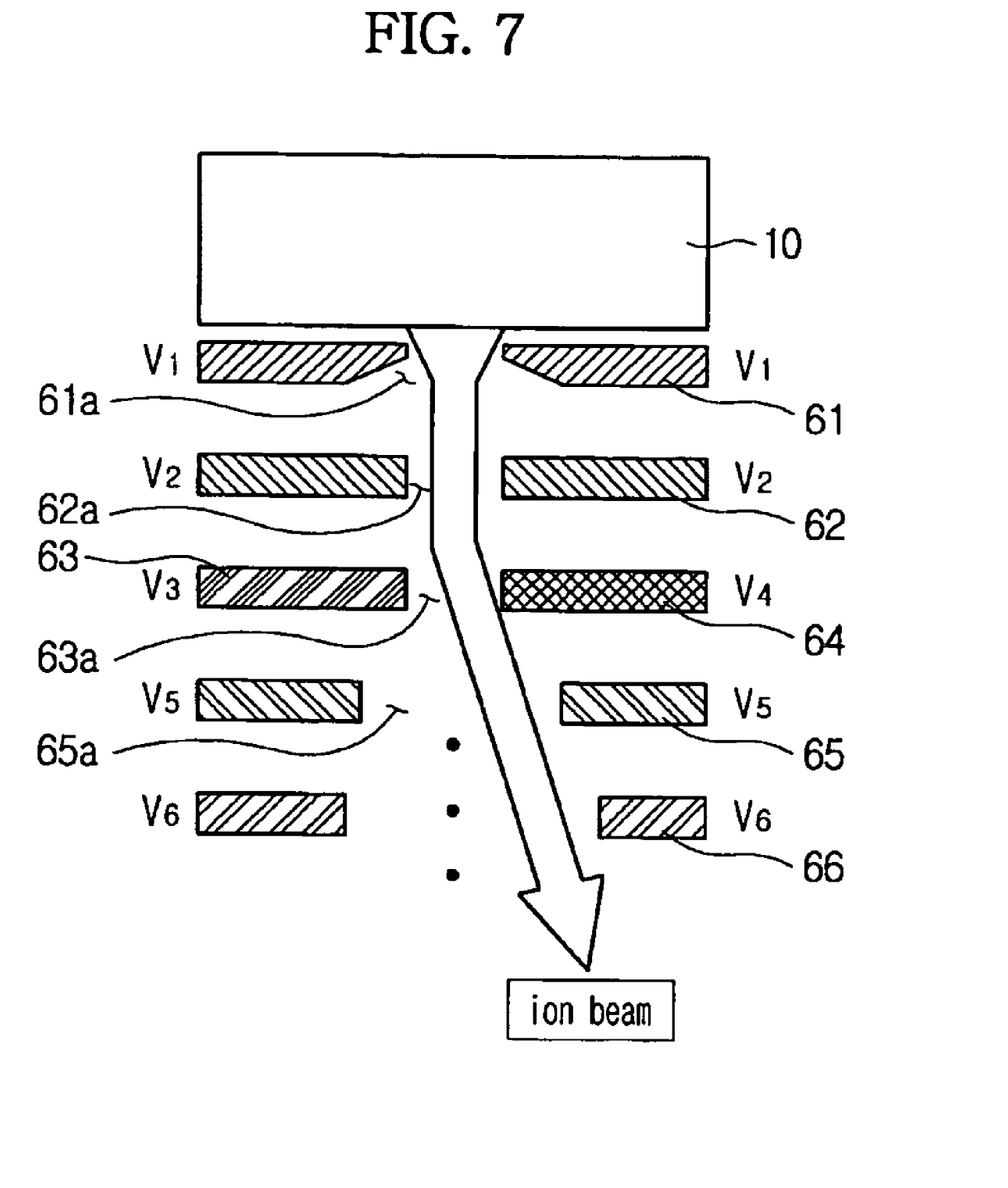
FIG. 7 is a schematic structural view illustrating an ion beam extractor according to an embodiment of the present general inventive concept.

FIG. 7 is a schematic structural view illustrating an ion beam extractor according to an embodiment of the present general inventive concept.

In FIG. 7, the ion beam extractor comprises a first grid 61 located at a rear end of an ion source 10 to which a first voltage $V_1$ is applied, a second grid 62 located at a rear end of the first grid 61 to which a second voltage $V_2$ is applied, a third grid 63 located at a rear end of one side of the second grid 62 to which a third voltage $V_3$ is applied, and a fourth grid 64 located at a rear end of the other side of the second grid 62 to which a fourth voltage $V_4$ is applied, and a fifth grid 65 located at a rear end of the third and fourth grids 63 and 64 to which a fifth voltage $V_5$ is applied, and the third and fourth grids 63 and 64 face each other. The number of stacked grids 61 to 65 may be increased or decreased. For example, a sixth grid 66 may be added to the grids 61 to 65, and may be located at a rear end of the fifth grid 65.

Each of the plurality of grids 61 to 65 is formed with a plurality of slits 61a, 62a, 63a and 65a, through which the ion beams are transmitted to the reflector 30 and the wafer 40 of FIG. 3.

After stacking a plurality of various grids, such as the plurality of grids 61 to 65 of FIG. 7, different voltages can be applied to the plurality of grids, respectively, to control the direction of the ion beams passing through the plurality of slits 61a, 62a, 63a and 65a.

Figure 8:
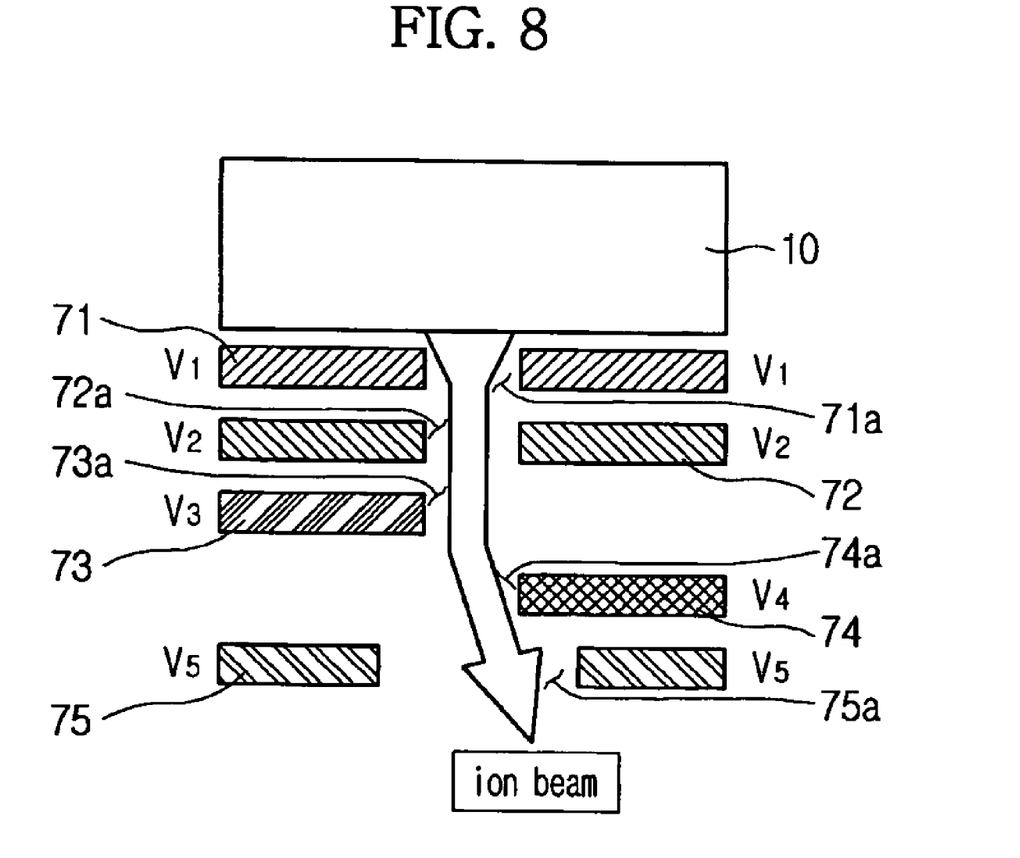
FIG. 8 is a schematic structural view illustrating an ion beam extractor according to another embodiment of the present general inventive concept.

FIG. 8 is a schematic structural view illustrating an ion beam extractor according to another embodiment of the present general inventive concept.

In FIG. 8, the ion beam extractor comprises a first grid 71 located at a rear end of an ion source 10 to which a first voltage $V_1$ is applied, a second grid 72 located at a rear end of the first grid 71 to which a second voltage $V_2$ is applied, a third grid 73 located at a rear end of one side of the second grid 72 to which a third voltage $V_3$ is applied, and a fourth grid 74 located at a rear end of the other side of the second grid 72 to which a fourth voltage $V_4$ is applied, and a fifth grid 75 located at a rear end of the third and fourth grids 73 and 74 to which a fifth voltage $V_5$ is applied, and the third grid 73 is diagonally symmetrical to the fourth grid 74.

As such, in a structure having a plurality of various grids, such as the plurality of grids 71 to 75 illustrated in FIG. 8, the plurality of slits 71a to 75a can have respective centers offset with respect to one another. Additionally, the plurality of slits 71a to 75a can have diameters that vary with respect to each other.

In this structure, voltages applied to the respective grids 71 to 75 can be different from each other, and a direction of the ion beams can be adjusted by controlling the voltages applied to the respective grids 71 to 75.

Figure 9:
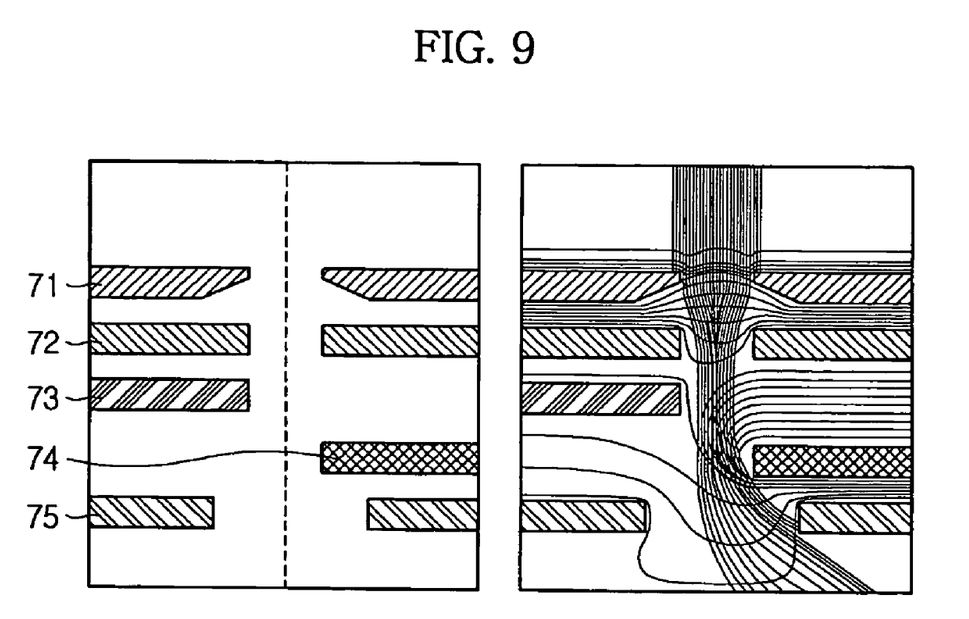
FIG. 9 is a view illustrating a schematic structure of an ion beam extractor according to another embodiment of the present general inventive concept, and a result of a simulation of the ion beam extractor.

FIG. 9 is a view illustrating an ion beam extractor according to another embodiment of the present general inventive concept, and a result of a simulation using the ion beam extractor.

Similar to the ion beam extractor illustrated in FIG. 8, the ion beam extractor according to the present embodiment of the general inventive concept also includes the plurality of grids 71 to 75, stacked in numerical order from top to bottom, and having the plurality of slits 71a to 75a illustrated in FIG. 8, respectively. The ion beam extractor according to the present embodiment has an arrangement of the slits 71a of the first grid 71 to which the first voltage $V_1$ is applied that is different from that of the embodiment of FIG. 8. Thus, the arrangement of the plurality of slits 71a to 75a may be varied.

As with the plurality of slits illustrated in FIG. 8, the plurality of slits 71a to 75a of the plurality of grids 71 to 75 of FIG. 9 have centers that are offset with respect to one another, and diameters that vary with respect to each other.

The offset type grids 71 to 75 are easily manufactured, and have a simple structure.

As apparent from the above description, an ion beam extractor of the general inventive concept allows rectangular ion beams to be extracted through a plurality of stacked grids, each having a plurality of slits, thereby increasing an ion beam extraction area and producing a high ion flux without increasing an output of the ion source (e.g., density of a plasma source).

Since a direction of the ion beam can be adjusted by controlling voltages applied to the plurality of stacked grids, each having the plurality of slits, there is no need to change an angle of the ion source and a reflector in order to change the direction of the ion beams, thereby allowing application of the ion beam extractor to various processes without modifications of hardware components.

The ion beam extractor can control the direction and an intensity of the ion beams, thereby securing a uniformity of a film to be etched while enhancing a uniformity of an etching rate for a wafer, thereby increasing a productivity of semiconductor diodes.

Although a few embodiments of the present general inventive concept have been shown and described, it would be appreciated by those skilled in the art that changes may be made in this embodiment without departing from the principles and spirit of the general inventive concept, the scope of which is defined in the claims and their equivalents.

What is claimed is:

1. An ion beam extractor apparatus, comprising:
   an ion source to produce an ion beam from a plasma; and
   at least one grid located in a progressing path of the ion beam produced by the ion source to adjust a direction of the ion beam by controlling a voltage magnitude applied to the at least one grid.

2. The apparatus according to claim 1, wherein the at least one grid comprises a plurality of plates to which different voltages are applied, respectively.

3. The apparatus according to claim 2, wherein the plurality of plates are arranged to correspond with respect to each other such that at least one slit through which the ion beam passes is formed between each pair of corresponding plates.

4. The apparatus according to claim 3, wherein the corresponding plates comprise:
   a first plate to define a first grid having a first semi-circular electrode member and a first plurality of elongated grid bars extending away from an inner surface of the first semi-circular electrode member; and a second plate to define a second grid having a second semi-circular electrode member and a second plurality of elongated grid bars extending away from an inner surface of the second semi-circular electrode member, and the first and second semi-circular electrode members are disposed opposite each other to form a full circle such that the first and second plurality of elongated grid bars are mated with each other.

5. The apparatus according to claim 4, wherein the mated first and second plurality of elongated grid bars form a plurality of slits therebetween through which the ion beam passes.

6. The apparatus according to claim 4, wherein a first voltage is applied to the first plurality of elongated grid bars and a second voltage is applied to the second plurality of elongated grid bars.

7. The apparatus according to claim 3, wherein the at least one slit comprises a plurality of slits to extract a rectangular ion beam.

8. The apparatus according to claim 1, wherein an output of the ion source is maintained at a constant level.

9. The apparatus according to claim 1, wherein the at least one grid is formed therein with at least one slit through which the ion beam passes.

10. The apparatus according to claim 9, wherein the at least one slit comprises a plurality of slits to extract a rectangular ion beam.

11. The apparatus according to claim 10, wherein the plurality of slits have an elongated rectangular shape extending across the at least one grid.

12. The apparatus according to claim 9, wherein the at least one grid comprises a plurality of grids stacked below a rear end of the ion source, each grid having the at least one slit formed therein, thereby allowing voltages that are applied to the respective grids to be controlled to adjust the direction of the ion beam.

13. The apparatus according to claim 12, wherein the at least one slit in each of the plurality of grids have respective centers that are offset with respect to one another.

14. The apparatus according to claim 1, further comprising:
a reflector located in parallel with a wafer at the same angle with respect to the wafer as the ion source to reflect the ion beam that passes through the at least one grid toward the wafer and to transform the reflected ion beam into a neutral beam.

15. The apparatus according to claim 14, wherein the at least one grid has an ion beam extraction of at least 50% of the area of the wafer.

16. An ion beam extractor apparatus, comprising:
an ion source to produce an ion beam from a plasma; and
a plurality of grids located in a progressing path of the ion beam produced by the ion source to adjust a direction of the ion beam by controlling a voltage magnitude applied to at least one of the plurality of grids.

17. The apparatus according to claim 16, wherein the plurality of grids are stacked below a rear end of the ion source, and each grid includes at least one corresponding slit formed therein to allow the ion beam to pass therethrough.

18. The apparatus according to claim 17, wherein each of the plurality of grids comprises a plurality of plates, and different voltages are applied to the respective grids to adjust the direction of the ion beam.

19. The apparatus according to claim 17, wherein at least two grids have corresponding slits having different dimensions.

20. The apparatus according to claim 17, wherein at least two grids are diagonally symmetrical to each other.

21. A grid unit usable with an ion beam extractor to extract, accelerate, and change a direction of ion beams, comprising:
a first grid having a first voltage applied thereto; and
a second grid disposed adjacent to the first grid and having a second voltage applied thereto, wherein the first and second grids form at least one slit through which the ion beams pass and the voltage magnitude of the first and second voltage control the direction of the ion beams.

22. The grid unit according to claim 21, wherein the second grid is stacked at a rear end with respect to the first grid in a different plane from the first grid.

23. The grid unit according to claim 21, wherein the first and second grid comprise grid plates having corresponding electrodes and corresponding mating elongated grid bars forming a plurality of slits therebetween, and the first and second grids are arranged in the same plane.

24. The grid unit according to claim 21, further comprising at least a third grid, a fourth grid, and a fifth grid.

25. A method of extracting an ion beam, the method comprising:
producing an ion beam from an ion source; and
adjusting a direction in which the ion beam progresses by controlling a voltage magnitude applied to at least one grid through which the ion beam passes.

* * * * *